United States Patent [19]

Yamamoto et al.

[11] Patent Number: 5,529,940
[45] Date of Patent: Jun. 25, 1996

[54] METHOD OF MANUFACTURING A VERTICAL MOSFET HAVING A GATE ELECTRODE OF POLYCRYSTALLINE SILICON

[75] Inventors: Masanori Yamamoto; Masami Sawada, both of Tokyo, Japan

[73] Assignee: NEC Corporation, Tokyo, Japan

[21] Appl. No.: 318,082

[22] Filed: Oct. 5, 1994

Related U.S. Application Data

[62] Division of Ser. No. 12,419, Feb. 2, 1993, abandoned.

[30] Foreign Application Priority Data

Feb. 3, 1992 [JP] Japan ......................................... 4-17344

[51] Int. Cl.⁶ ............................................... H01L 21/265
[52] U.S. Cl. .................. 437/40; 437/41; 437/44; 437/45; 437/27
[58] Field of Search ............................... 437/40, 41, 44, 437/45, 27

[56] References Cited

U.S. PATENT DOCUMENTS

| | | | |
|---|---|---|---|
| 4,688,323 | 8/1987 | Yoshida et al. | 437/29 |
| 4,914,047 | 4/1990 | Seki | 437/41 |
| 4,970,173 | 11/1990 | Robb | 437/40 |
| 5,118,638 | 6/1992 | Fujihira | 437/41 |
| 5,158,903 | 10/1992 | Hori et al. | 437/45 |
| 5,164,327 | 11/1992 | Maruyama | 437/40 |
| 5,177,569 | 1/1993 | Koyama et al. | 257/412 |
| 5,191,396 | 3/1993 | Lidow et al. | 257/339 |
| 5,248,627 | 9/1993 | Williams | 437/45 |

FOREIGN PATENT DOCUMENTS

| | | | |
|---|---|---|---|
| 0484321 | 5/1992 | European Pat. Off. | 437/40 |
| 0188374 | 8/1987 | Japan | 437/40 |
| 0260856 | 10/1989 | Japan | 437/40 |

OTHER PUBLICATIONS

Sung, J., et al., "A Comprehensive Study on p⁺ Polysilicon-Gate MOSFET's Instability with Fluorine Incorporation", *IEEE Transactions on Electron Devices*, vol. 37, No. 11, Nov., 1990, pp. 2312–2321.

Wong, C., et al., "Mobile Ion Gettering in Passivated p⁺ Polysilicon Gates", *Symposium on VLSI Technology*, 1990, pp. 123–124.

*Primary Examiner*—Trung Dang
*Attorney, Agent, or Firm*—Young & Thompson

[57] ABSTRACT

A method of manufacturing a MOSFET having a p-type gate electrode made of polycrystalline silicon formed through a gate insulating film on a surface of a conductive semiconductor substrate. The gate electrode contains an n-type impurity in addition to a boron impurity. Low threshold voltage can be obtained with less fluctuation. Preferably, the n-type impurity is phosphorus and/or arsenic, and the concentration thereof ranges from $5\times10^{18}$ to $1\times10^{20}$ $cm^{-3}$. A channel, which is formed in the surface of the gate insulating film side of the substrate, preferably has a positive polarity.

15 Claims, 3 Drawing Sheets

METHOD OF MANUFACTURING A VERTICAL MOSFET HAVING A GATE ELECTRODE OF POLYCRYSTALLINE SILICON

This application is a division of application Ser. No. 08/012,419, filed Feb. 2, 1993, now abandoned.

BACKGROUND OF THE INVENTION

1. Field of the Invention

The invention relates to a vertical metal oxide semiconductor field effect transistor (MOSFET) and a manufacturing method thereof and more particularly, to a vertical MOSFET which has a gate electrode made of polycrystalline silicon doped with p-type and n-type impurities and a manufacturing method thereof.

2. Description of the Related Art

Generally, a vertical MOSFET has a source electrode and a gate electrode made of polycrystalline silicon which are laminated on the surface of an epitaxial layer formed on a silicon substrate. The MOSFET has a drain electrode on the reverse surface of the substrate. A source region is formed in the surface area of the epitaxial layer and a channel is formed in a surface region, which is in contact with the gate oxide film, of the epitaxial layer. The substrate and epitaxial layer serve as a drain region.

For a conventional vertical MOSFET, phosphorus (P) is ion-implanted into a polycrystalline silicon film forming a gate electrode to make the conductivity type of the MOSFET n, so that the sheet resistance of the film becomes about 10 $\Omega/\square$ to lessen the gate resistance, namely, gate electrode resistance. If the gate resistance is small, a high switching speed is provided as understood From the following expression:

$$t = f(1/CR_G) \quad (1)$$

where t is the switching speed, C is the gate capacitance, and $R_G$ is the gate resistance.

On the other hand, the threshold voltage of an FET, $V_T$, is generally represented by the following expression:

$$V_T = \phi_{MS} - (Q_{SS}/C_0) + 2\phi_f - (Q_B/C_0) \quad (2)$$

where $\phi_{MS}$ is the work function difference between the gate electrode material and the substrate semiconductor, $Q_{SS}$ is the charge on the surfaces of the gate oxide film side of the substrate semiconductor, $Q_B$ is the charge of the depletion layer of the substrate semiconductor, $C_O$ is the gate oxide film capacitance, and $\phi_f$ is the Fermi level of the substrate semiconductor.

The work function difference $\phi_{MS}$ is substantially 0 V between the n-type polycrystalline silicon of the gate electrode and the n-type single crystal silicon of the substrate. As understood from the expression (2), when the gate electrode is made of n-type polycrystalline silicon, the absolute value of the threshold voltage $V_T$ is greater by about 0.9 V than the case where it is made of p-type polycrystalline silicon. Thus, it is difficult to drive the FET at low voltage although the switching speed of the FET becomes high.

If boron (B) rather than phosphorus is ion-implanted into a polycrystalline silicon film as a gate electrode to make conductivity type p, some boron ions pass through the gate oxide film even if thermal processing for the p-type polycrystalline silicon film is performed at a temperature of about 900° C. as a result, the FETs vary in threshold voltage $V_T$.

SUMMARY OF THE INVENTION

Accordingly, it is an object of the invention to provide vertical MOSFET which is low in threshold voltage.

Another object of the invention is to provide a manufacturing method of the MOSFET which is less susceptible to threshold voltage fluctuation.

According to a first aspect of the invention, there is provided a vertical MOSFET, which includes a p-type gate electrode made of polycrystalline silicon formed through a gate insulating film on a first or second surface of a conductive semiconductor substrate. The gate electrode contains an n-type impurity in addition to a boron (B) impurity as a p-type impurity.

Preferably, the n-type impurity is at least one of phosphorus (P) and arsenic (As) impurities. Preferably, the concentration of the n-type impurity ranges from $5 \times 10^{18}$ to $1 \times 10^{20}$ cm$^{-3}$. If only one of the phosphorus and arsenic impurities is only contained, the concentration of the impurity needs to range from $5 \times 10^{18}$ to $1 \times 10^{20}$ cm$^{-3}$. If both the phosphorus and arsenic impurities are contained, the total concentration of the impurities may range from $5 \times 10^{18}$ to $1 \times 10^{20}$ cm$^{-3}$.

A channel, which is formed around a surface in the gate insulating film side of the semiconductor substrate, preferably has a positive polarity.

Manufacturing conditions and desired FET characteristics should be considered to determine the boron impurity concentration.

With the MOSFET of the invention, an n-type impurity in addition to boron as a p-type impurity is contained in the gate electrode made of polycrystalline silicon for preventing boron ions from passing through the gate oxide film into the semiconductor substrate; thus the MOSFET can be less susceptible to threshold voltage fluctuation.

Besides, since the conductivity type of the polycrystalline silicon film is p, the absolute value of the threshold voltage is smaller than that when the conductivity type is n. Therefore, the MOSFET can be driven at a low voltage.

According to a second aspect of the invention, there is provided a method of manufacturing a vertical MOSFET, which comprises the steps of forming an insulating film on a surface of a conductive semiconductor substrate; forming a polycrystalline silicon film on the insulating film; doping the polycrystalline silicon film with an n-type impurity; patterning the polycrystalline silicon film doped with the n-type impurity and the gate insulating film; producing an n-type polycrystalline silicon gate electrode and a gate insulating film and doping the n-type polycrystalline silicon gate electrode with a p-type impurity such as boron to thereby produce a p-type polycrystalline silicon electrode.

Preferably, the polycrystalline silicon film doped with the n-type impurity is doped with the p-type impurity at the same time as a step of forming a p-type region is formed in the semiconductor substrate. Apart from this step, another step of doping the polycrystalline silicon film with the p-type impurity may be added. In this case, the amount of the p-type impurity with which the polycrystalline silicon film is doped can be set independently of the impurity concentration required for forming the p-type region, so that the resistance value of the gate electrode can be easily controlled. Making the gate resistance small provides high switching speed.

Further, doping the polycrystalline silicon film with the p-type impurity may be suppressed at the step of forming the p-type region in the semiconductor substrate. In this case, polycrystalline silicon film is doped with the p-type impurity at a separate step from the step of forming the p-type region.

Preferably, the type and concentration of the n-type impurity are made the same as those for the above-mentioned FET.

The FET according to the first aspect of the invention can be easily provided by the manufacturing method.

DESCRIPTION OF THE PREFERRED EMBODIMENTS

Referring now to the accompanying drawings, preferred embodiments of the invention will be described below.
[First embodiment]

Figure 1A:
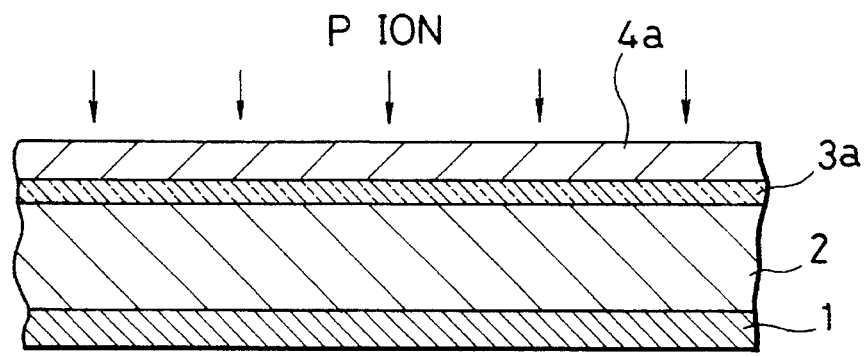
FIGS. 1A–1C are fragmentary sectional views showing process steps of a method of manufacturing vertical MOSFET according to a first embodiment of the invention respectively.
Figure 1B:
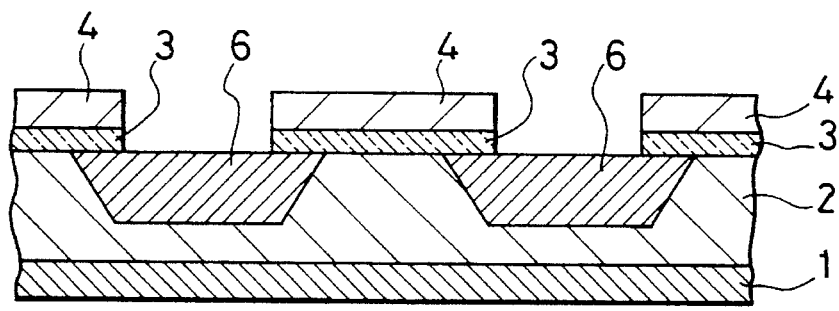
Figure 1C:
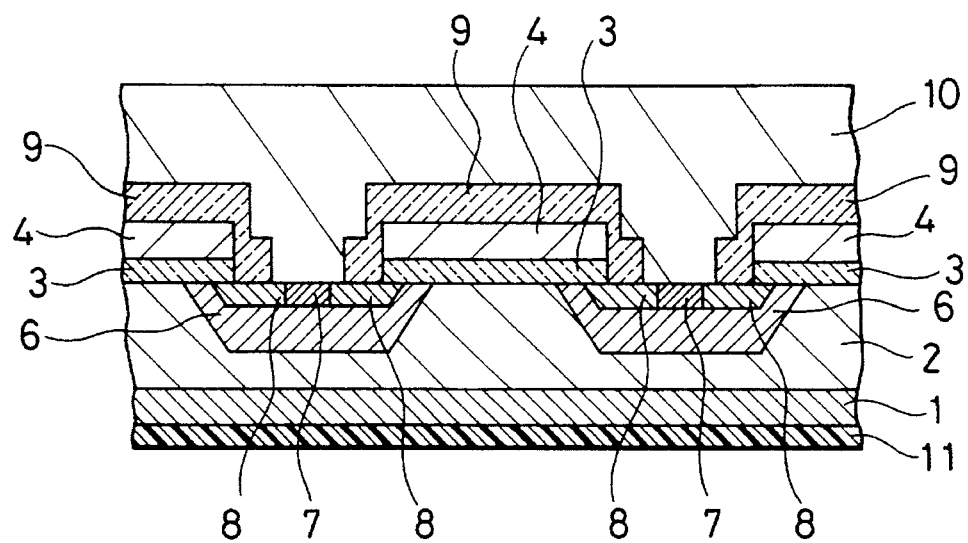

FIG. 1C shows a p-channel vertical MOSFET according to a first embodiment of the invention. Here a plurality of the FETs integrated on a $p^+$-type silicon substrate is partially shown.

The FET of the first embodiment has an epitaxial layer 2 of $p^-$-type silicon (about 20–100 nm thick) on a surface of a $p^+$-type silicon substrate 1 and n-type base regions 6 in the epitaxial layer 2. An $n^+$-type region 7 which acts as a back gate is formed in the approximate center near the surface of the inside of each base region 6, and $p^+$-type source regions 8 are formed on both sides of the $n^+$-type region 7.

On the surface of the epitaxial layer 2, gate oxide films 3 made of silicon oxide are formed, each of which is straddling its adjacent base regions 6 and overlapping the peripheries of the base regions 6 and parts of the source regions 8. A channel is formed in the surface of the n-type base region 6 just below each gate oxide film 3 and has a positive polarity. Formed just above each gate oxide film 3 is a gate electrode 4 made of polycrystalline silicon (about 600 nm thick).

The gate electrodes 4 are doped with phosphorus ions as an n-type impurity and boron ions as a p-type impurity. The polycrystalline silicon concentration of the phosphorus ions as dopant ranges from $5\times10^{15}$ to $1\times10^{20}$ $cm^{-3}$, which is slightly lower than that of the boron ions as dopant; therefore, the conductivity type of each gate electrode 4 is p.

The concentration of the boron ions needs only to be set to that at which the conductivity type of each gate electrode 4 becomes p; it can be selected as desired within the range satisfying the condition according to the desired characteristics of the FET.

Each of the gate electrodes 4 and each of the gate oxide films 3 are covered with an interlayer insulating film 9 (about 500–1000 nm thick). The surface of the interlayer insulating film 9 is covered with a source electrode 10 made of aluminum. The source electrode 10 is connected to the $n^+$-type region 7 and the $p^+$-type source regions 8 through corresponding contact holes formed in the interlayer insulating film 9.

The reverse surface of the substrate 1 is covered with a drain electrode 11 made of material such as Au or Ni.

An electric current flows through the source electrode 10, the source region 8, the channel on the surface of the base region 6, the epitaxial layer 2, the substrate 1 and the drain electrode 11 in this order.

The MOSFET of the above structure is manufactured as described below:

First, as shown in FIG. 1A, the epitaxial layer 2 is grown on the surface of the silicon substrate 1. Laminated on the epitaxial layer 2 are a silicon oxide film 3a which is to be the gate oxide films 3 and a polycrystalline silicon film 4a which is to be the gate electrodes 4 in this order, for example, by a chemical vapor deposition (CVD) method.

Next, as shown in FIG. 1A, phosphorus is ion-implanted into the polycrystalline silicon film 4a at a dose in such a range as from $3\times10^{14}$ to $3\times10^{15}$ $cm^{-2}$ for making the conductivity type of the film 4a n. The ion implantation condition is set so that the concentration of the phosphorus ions as dopant ranges from $5\times10^{15}$ to $1\times10^{20}$ $cm^{-3}$.

Next, patterning is performed so as to form transparent holes in the silicon oxide film 3a and the n-type polycrystalline silicon film 4a, as shown in FIG. 1B, thereby forming the gate oxide films 3 and the n-type polycrystalline silicon gate electrodes 4.

Next, phosphorus is ion-implanted into the epitaxial layer 2 to form the n-type base regions 6. Then the surfaces of the places where the $p^+$regions 8 are to be formed are masked, and phosphorus is ion-implanted into the base regions 6 to form the $n^+$regions 7. In the ion-implantation process, phosphorus is not ion-implanted into the gate electrodes 4.

Next, only the surfaces of the $n^+$regions 7 are masked, then boron is ion-implanted at a dose in such a range as from $5\times10^{15}$ to $1\times10^{16}$ $cm^{-2}$ to form the $p^+$regions 8 within each of the base regions 6. In the process, boron is ion-implanted into the gate electrodes 4 of n-type polycrystalline silicon as well as into the base regions 6, so that the conductivity type of each of the gate electrodes 4 changes to p.

At this time, each of the gate electrodes 4 contains phosphorus ions as an n-type impurity and boron ions as a p-type impurity at almost identical concentrations, exactly speaking, the concentration of the boron is slightly higher than that of the phosphorus. The phosphorus ions in the gate electrodes 4 prevent boron ions from passing through the gate oxide films 3 into the base regions 6 and as a result, the FETs thus formed can be made stable in threshold voltage.

Next, the interlayer insulating film 9 is formed to cover the surfaces of the base regions 6, the gate oxide films 3 and the gate electrodes 4. The contact holes are formed in the insulating film 9 and then, the source electrode 10 and the drain electrode 11 are formed in this order. Thus the FETs of the structure shown in FIG. 1C can be obtained.
[Second embodiment]

Figure 2A:
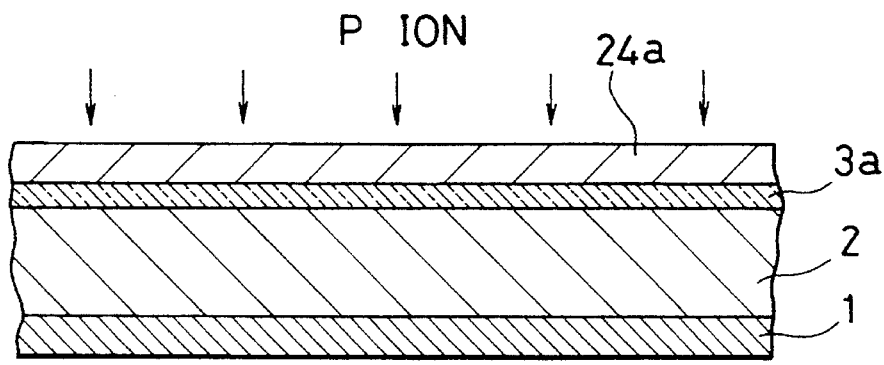
FIGS. 2A–2D are fragmentary sectional views showing process steps of a method of manufacturing vertical MOSFET according to a second embodiment of the invention respectively.
Figure 2B:
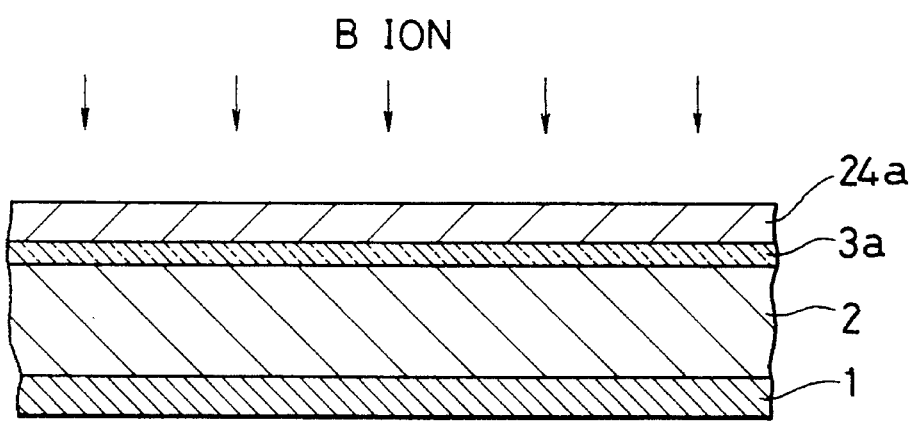
Figure 2C:
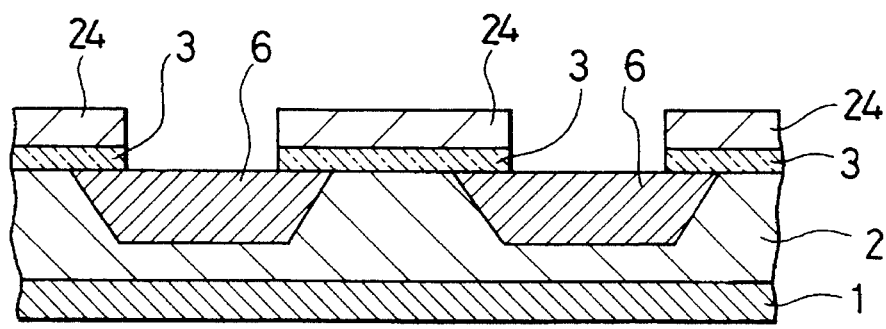
Figure 2D:
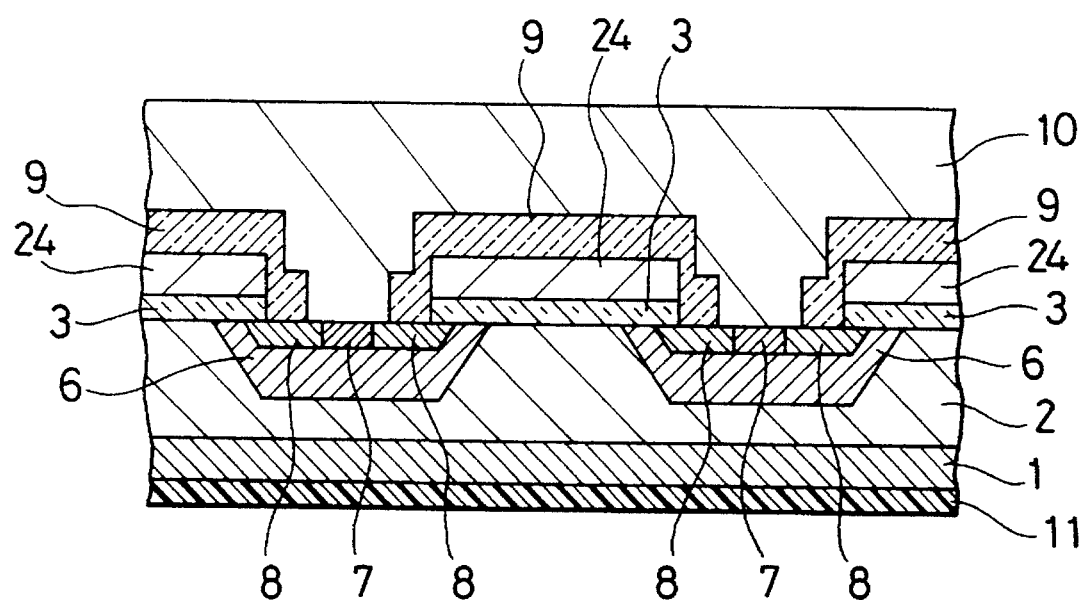

FIG. 2D shows a vertical MOSFET according to a second embodiment of the invention. The FET according to the embodiment has the same structure as that according to the first embodiment except that the boron ion concentration in each gate electrode 24 is higher than that in the first embodiment. The corresponding parts to those shown in FIG. 1C are designated by the same reference numerals in FIG. 2D, and will therefore not be discussed again.

The gate electrode 24 made of p-type polycrystalline silicon contains boron ions at a higher concentration as compared with the gate electrode 4 in the first embodiment, so that the electrode 24 is low in resistance thereby making the switching speed of the FET higher than that in the first embodiment.

The MOSFET according to the second embodiment are manufactured as described below:

First, as with the first embodiment, as shown in FIG. 2A laminated on an epitaxial layer 2 are the silicon oxide film 3a which is to be the gate oxide films 3 and a polycrystalline silicon film 24a which is to be the gate electrodes 24 in this order.

Next, as shown in FIG. 2A, phosphorus is ion-implanted into the polycrystalline silicon film 24a at a dose in such a range as from $3\times10^{14}$ to $3\times10^{15}$ cm$^{-2}$ for making the conductivity type of the polycrystalline silicon film 24a n, as with the first embodiment. The concentration of the phosphorus to be ion-implanted is set in the range of from $5\times10^{15}$ to $1\times10^{20}$ cm$^{-3}$.

Next, as shown in FIG. 2B, boron is further ion-implanted into the n-type polycrystalline silicon film 24a into which phosphorus has been ion-implanted. Although boron is ion-implanted into the film 24a as well as into the p$^+$-type source regions 8 at the step of forming the regions 8 by ion implantation in the first embodiment, a dedicated step of boron ion implantation for the film 24 A is added, apart from the step of forming the p-type regions 8, in the second embodiment. The dose of the boron ions in the dedicated step ranges, for example, from $5\times10^{15}$ to $1\times10^{16}$ cm$^{-2}$.

Next, as shown in FIG. 2C, the silicon oxide film 3a and the phosphorus- and boron-doped polycrystalline silicon film 24a are etched to form the gate oxide films 3 and the n-type or p-type gate electrodes 24. At this time, the conductivity type of the gate electrode 24 is made n or p depending on the phosphorus or boron ion concentration, whichever is the higher.

Next, as with the first embodiment, phosphorus is ion-implanted into the epitaxial layer 2 to form the n-type base regions 6, then the n$^+$region 7 are formed in the respective base regions 6.

Next, only the surfaces of the n$^+$regions 7 are masked, then boron is ion-implanted at a dose in such a range as from $5\times10^{15}$ to $1\times10^{16}$ cm$^{-2}$ to form the p$^+$ source regions 8 within each of the base regions 6. In the process, boron is ion-implanted into the gate electrodes 24 of polycrystalline silicon as well as into the base regions 6, so that the conductivity type of each of the gate electrodes 24 changes to p if it is n. If it is p, the conductivity type does not change and the boron ion concentration increases only.

Next, the interlayer insulating film 9 is formed to cover the surfaces of the base regions 6, the gate oxide films 3 and the gate electrodes 24. Contact holes are formed in the insulating films 9 and thereafter, the source electrode 10 and the drain electrode 11 are formed in this order. The FETs of the structure shown in FIG. 2D is thus obtained.

This manufacturing method according to the second embodiment enables resistance of the polycrystalline silicon film 24a to be set independently of the concentration of the boron to be ion-implanted into the source region 8 at the step of ion-implanting boron into the film 24a, so that it can provide advantages of precise control of gate resistance and improvement of the switching speed of the FET.

Since boron has already been ion-implanted into the polycrystalline silicon film 24a in the manufacturing method according to the second embodiment, boron is not necessarily ion-implanted at the step of forming the p$^+$ source regions 8. However, if boron is not ion-implanted in this step, the boron ion concentration needs to be set so that the conductivity type of the polycrystalline silicon film 24a changes to p at the step (FIG. 2B) of ion-implanting boron into the film 24a.

If no boron is to be ion-implanted into the polycrystalline silicon film 24a at the step of forming the p$^+$ regions 8, the remaining film 24a needs only to be masked.

As described above, for the vertical MOSFETs according to the first and second embodiments, phosphorus is ion-implanted into the gate electrode 4 or 24 made of the polycrystalline silicon film 4a or 24a so that the concentration of the phosphorous is in the range of $5\times10^{18}$ to $1\times10^{20}$ cm$^{-3}$ and the conductivity type of the gate electrodes 4 and 24 is made p. Thus boron ions can be prevented from passing through the gate oxide films 3. Resultantly, the FETs can be stabilized in threshold voltage while the threshold voltage is reduced approximately by 0.9 V.

In both of the above embodiments, the channels are of p type, but may be of n type if the above-mentioned condition on the gate electrodes is satisfied. Although only phosphorus is indicated as a p-type impurity, arsenic having an equivalent nature to phosphorus as a p-type impurity can also be used.

What is claimed is:

1. A method of manufacturing a vertical metal-oxide-semiconductor field-effect transistor comprising the steps of:

forming an insulating film on a surface of a conductive semiconductor substrate;

forming a polycrystalline silicon film on said insulating film;

doping said polycrystalline silicon film with an n-type impurity;

patterning said polycrystalline silicon film doped with said n-type impurity and said insulating film, thereby producing an n-type polycrystalline silicon gate electrode and a gate insulating film;

doping said n-type polycrystalline silicon gate electrode with a p-type impurity, thereby producing a p-type polycrystalline silicon gate electrode on said gate insulating film;

wherein said n-type impurity doped into said polycrystalline silicon film acts to prevent said p-type impurity doped into said n-type polycrystalline silicon gate electrode from passing through said gate insulating film into said substrate.

2. The method as claimed in claim 1, wherein said n-type impurity is at least one of phosphorus and arsenic.

3. The method as claimed in claim 2, wherein an amount of said n-type impurity doped into said polycrystalline silicon film with which said polycrystalline silicon film is doped is set so that the concentration of said n-type impurity ranges from $5\times10^{18}$ to $1\times10^{20}$ cm$^{-3}$.

4. The method as claimed in claim 1, wherein a p-type region is formed in said substrate during said step of doping said n-type polycrystalline silicon film with said p-type impurity.

5. The method as claimed in claim 1, wherein said p-type impurity is boron.

6. A method of manufacturing a vertical metal-oxide-semiconductor field-effect transistor, said method comprising the steps of:

(a) forming an insulating film on a first surface of a p-type semiconductor substrate;

(b) forming a polycrystalline silicon film on said insulating film;

(c) doping said polycrystalline silicon film with a first n-type impurity;

(d) patterning said polycrystalline silicon film doped with said first n-type impurity and said insulating film, thereby producing an n-type polycrystalline silicon gate electrode and a gate insulating film;

(e) doping said substrate with a second n-type impurity through a penetrating hole formed in said polycrystalline silicon film doped with said first n-type impurity and said insulating film, thereby forming an n-type base region in said substrate;

(f) doping said substrate and said n-type polycrystalline silicon gate electrode with a p-type impurity, thereby forming a p-type source region in said substrate and changing a conductivity type of said n-type polycrystalline silicon gate electrode to a p-type;

(g) forming an interlayer insulating film to cover said p-type polycrystalline silicon gate electrode and said gate insulating film;

(h) forming a contact hole in said interlayer insulating film;

(i) forming a source electrode on said interlayer insulating film to be contacted with said source region through said contact hole of interlayer insulating film; and (j) forming a drain electrode on a second surface of said substrate;

wherein said first n-type impurity doped into said polycrystalline silicon film acts to prevent said p-type impurity doped into said n-type polycrystalline silicon gate electrode from passing through said gate insulating film into said substrate.

7. The method as claimed in claim 6, wherein said n-type impurity is at least one of phosphorus and arsenic.

8. The method as claimed in claim 6, wherein the amount of said first n-type impurity doped into said polycrystalline silicon film is set so that the concentration of said n-type impurity ranges from $5 \times 10^{18}$ to $1 \times 10^{20}$ cm$^{-3}$.

9. The method as claimed in claim 6, wherein said p-type impurity is boron.

10. The method as claimed in claim 6, further comprising a step of doping a third n-type impurity into said n-type base region to form an n$^+$− type region in said base region between said steps of (e) and (f).

11. A method of manufacturing a vertical metal-oxide-semiconductor field-effect transistor, said method comprising the steps of:

(a) forming an insulating film on a first surface of a p-type semiconductor substrate;

(b) forming a polycrystalline silicon film on said insulating film;

(c) doping said polycrystalline silicon film with a first n-type impurity;

(d) doping said n-type polycrystalline silicon film doped with said first n-type impurity with a first p-type impurity wherein the result of step (c) and (d) produces an n-type polycrystalline silicon layer;

(e) patterning said n-type polycrystalline silicon layer doped with said first n-type impurity and said first p-type impurity and said insulating film, thereby producing an n-type polycrystalline silicon gate electrode and a gate insulating film;

(f) doping said substrate with a second n-type impurity through a penetrating hole formed in said n-type polycrystalline silicon layer doped with said first n-type impurity and said first p-type impurity and said insulating film to form an n-type base region in said substrate;

(g) doping said substrate and said n-type polycrystalline silicon gate electrode with a second p-type impurity, thereby forming a p-type source region in said substrate and changing said n-type polycrystalline silicon gate electrode to a p-type polycrystalline silicon gate electrode;

(h) forming an interlayer insulating film to cover said p-type polycrystalline silicon gate electrode and said gate insulating film;

(i) forming a contact hole in said interlayer insulating film;

(j) forming a source electrode on said interlayer insulating film to be contacted with said source region through said contact hole of said interlayer insulating film; and (k) forming a drain electrode on a second surface of said substrate;

wherein said first n-type impurity doped into said polycrystalline silicon film acts to prevent said first and second p-type impurities doped into said polycrystalline silicon gate electrode doped with said first n-type impurity from passing through said gate insulating film into said substrate.

12. The method as claimed in claim 11, wherein each of said first and second n-type impurities is at least one of phosphorus and arsenic.

13. The method as claimed in claim 11, wherein the amount of said first n-type impurity doped into said polycrystalline silicon film is set so that the concentration of said n-type impurity ranges from $5 \times 10^{18}$ to $1 \times 10^{20}$ cm$^{-3}$.

14. The method as claimed in claim 11, wherein said first and second p-type impurities are boron.

15. The method as claimed in claim 11, further comprising a step of doping a third n-type impurity into said n-type base region to form an n$^+$− type region in said base region between said steps of (f) and (g).

* * * * *